United States Patent
Zampardi, Jr. et al.

(10) Patent No.: US 10,158,010 B2
(45) Date of Patent: Dec. 18, 2018

(54) METHODS OF FORMING A BIPOLAR TRANSISTOR HAVING A COLLECTOR WITH A DOPING SPIKE

(71) Applicant: SKYWORKS SOLUTIONS, INC., Woburn, MA (US)

(72) Inventors: Peter J. Zampardi, Jr., Newbury Park, CA (US); Kai Hay Kwok, Thousand Oaks, CA (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 15/666,465

(22) Filed: Aug. 1, 2017

(65) Prior Publication Data

US 2017/0358667 A1 Dec. 14, 2017

Related U.S. Application Data

(63) Continuation of application No. 15/197,611, filed on Jun. 29, 2016, now Pat. No. 9,722,058, which is a
(Continued)

(51) Int. Cl.
*H01L 29/73* (2006.01)
*H01L 29/737* (2006.01)
(Continued)

(52) U.S. Cl.
CPC .......... *H01L 29/7378* (2013.01); *H01L 23/66* (2013.01); *H01L 29/0821* (2013.01); *H01L 29/0826* (2013.01); *H01L 29/165* (2013.01); *H01L 29/205* (2013.01); *H01L 29/36* (2013.01); *H01L 29/365* (2013.01); *H01L 29/66242* (2013.01); *H01L 29/73* (2013.01); *H01L 29/737* (2013.01); *H01L 29/7325* (2013.01); *H01L 29/7371* (2013.01); *H01L 2223/665* (2013.01); *H01L 2223/6655* (2013.01); *H01L 2223/6677* (2013.01); *H01L 2223/6683* (2013.01);
(Continued)

(58) Field of Classification Search
CPC .......... H01L 29/7378; H01L 29/66242; H01L 29/0826; H01L 29/165; H01L 29/205; H01L 29/7325; H01L 29/365; H01L 29/0821; H01L 29/7371; H01L 29/737; H01L 23/66
USPC ................ 257/197, 198, 200, 565, E29.034, 257/E29.189, E21.387, E21.388; 438/317, 342, 235, 91
See application file for complete search history.

(56) References Cited

U.S. PATENT DOCUMENTS 6,031,256 A * 2/2000 Liu ..................... H01L 29/7371
257/12
6,563,145 B1 * 5/2003 Chang ................. H01L 29/0821
257/197

(Continued)

*Primary Examiner* — Dao H Nguyen
(74) *Attorney, Agent, or Firm* — Chang & Hale LLP

(57) ABSTRACT

This disclosure relates to methods of forming bipolar transistors, such as heterojunction bipolar transistors. The methods may include forming a sub-collector over a substrate, forming a first portion of a collector over the sub-collector and doping a second portion of the collector to form a doping spike. The method may further include forming a third portion of the collector over the doping spike and forming a base of the bipolar transistor over the third portion of the collector.

12 Claims, 8 Drawing Sheets

Related U.S. Application Data continuation of application No. 14/720,519, filed on May 22, 2015, now Pat. No. 9,385,200, which is a continuation of application No. 13/870,682, filed on Apr. 25, 2013, now Pat. No. 9,070,732.

(60) Provisional application No. 61/639,784, filed on Apr. 27, 2012.

(51) Int. Cl.

| | |
|---|---|
| *H01L 29/08* | (2006.01) |
| *H01L 29/36* | (2006.01) |
| *H01L 29/732* | (2006.01) |
| *H01L 23/66* | (2006.01) |
| *H01L 29/165* | (2006.01) |
| *H01L 29/205* | (2006.01) |
| *H01L 29/66* | (2006.01) |
| *H03F 3/195* | (2006.01) |
| *H03F 3/213* | (2006.01) |

(52) U.S. Cl.
CPC ............ *H03F 3/195* (2013.01); *H03F 3/213* (2013.01); *H03F 2200/451* (2013.01)

(56) References Cited

U.S. PATENT DOCUMENTS

| | | | | |
|---|---|---|---|---|
| 6,797,996 B1 * | 9/2004 | Hikita | ............ | H01L 29/0821 |
| | | | | 257/197 |
| 2002/0177253 A1 * | 11/2002 | Johnson | ............ | H01L 29/0821 |
| | | | | 438/91 |
| 2006/0163610 A1 * | 7/2006 | Sawada | ............ | H01L 29/0817 |
| | | | | 257/197 |
| 2007/0001195 A1 * | 1/2007 | Shen | ............ | H01L 29/0821 |
| | | | | 257/198 |
| 2010/0314665 A1 * | 12/2010 | Nogome | ............ | H01L 29/0821 |
| | | | | 257/197 |

* cited by examiner

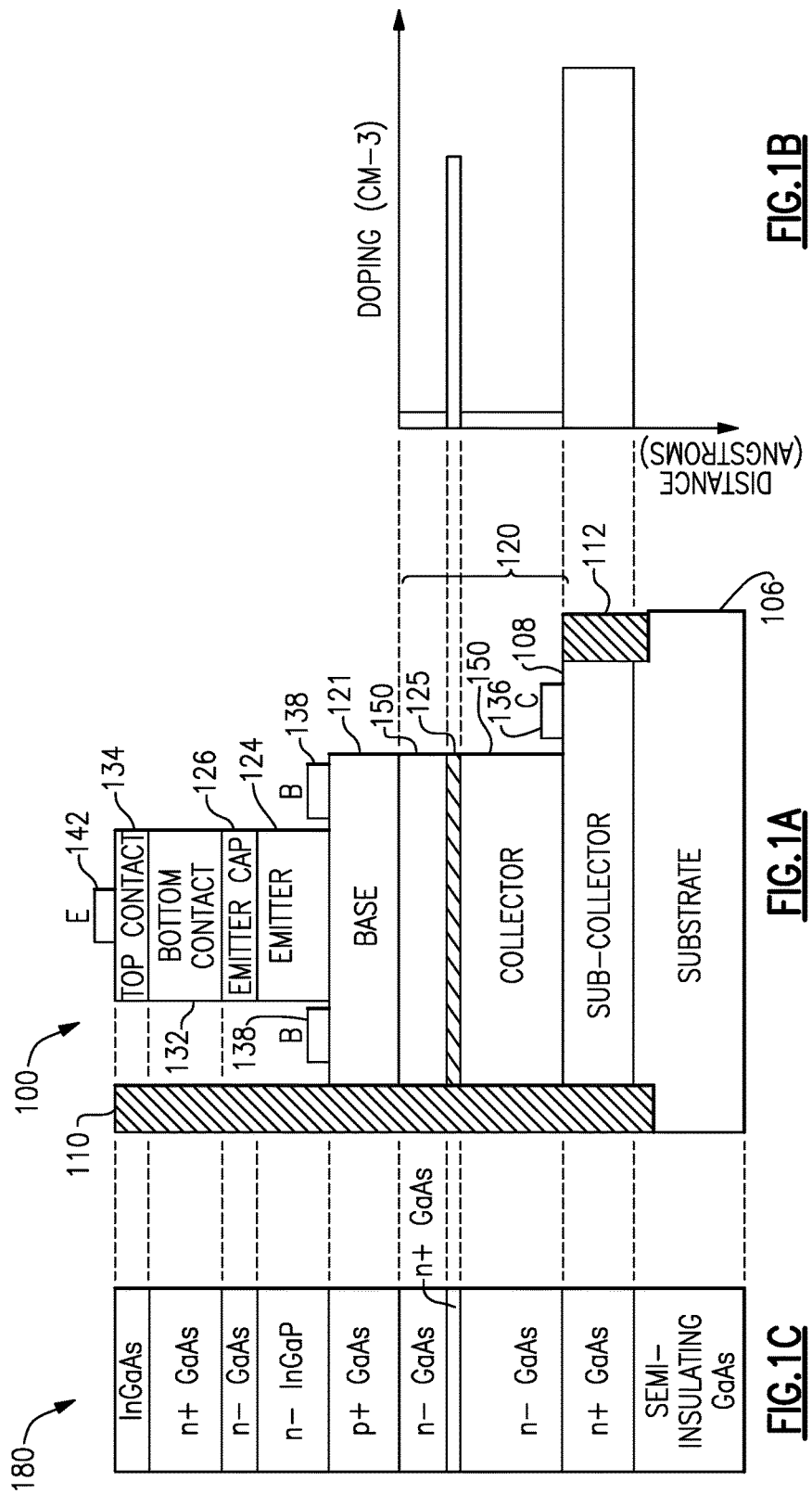

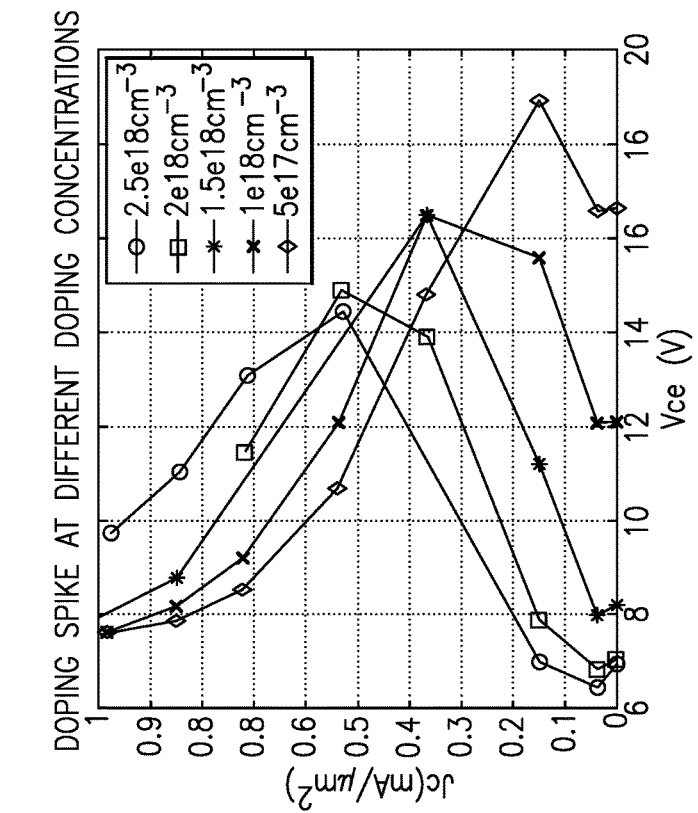
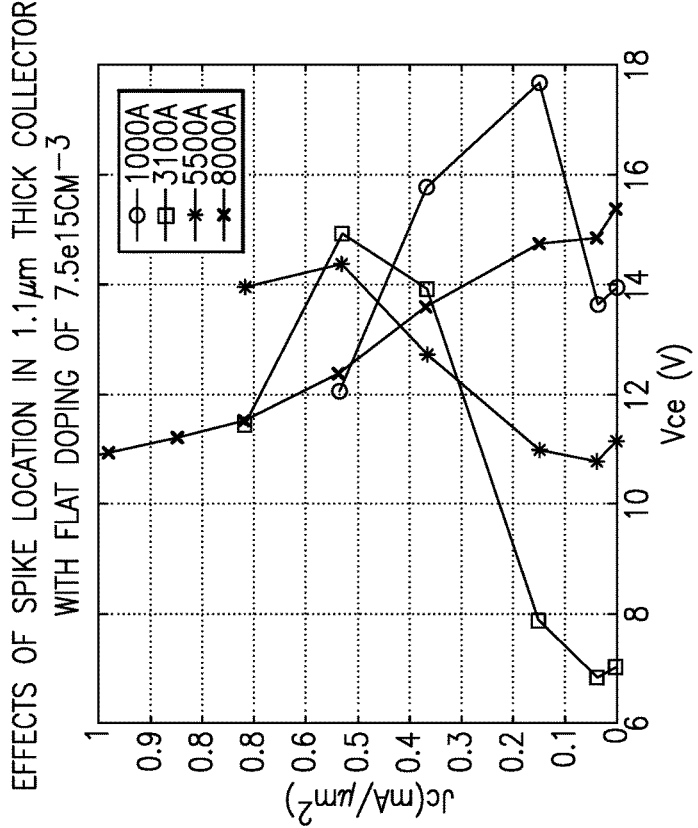
FIG. 2B
FIG. 2A

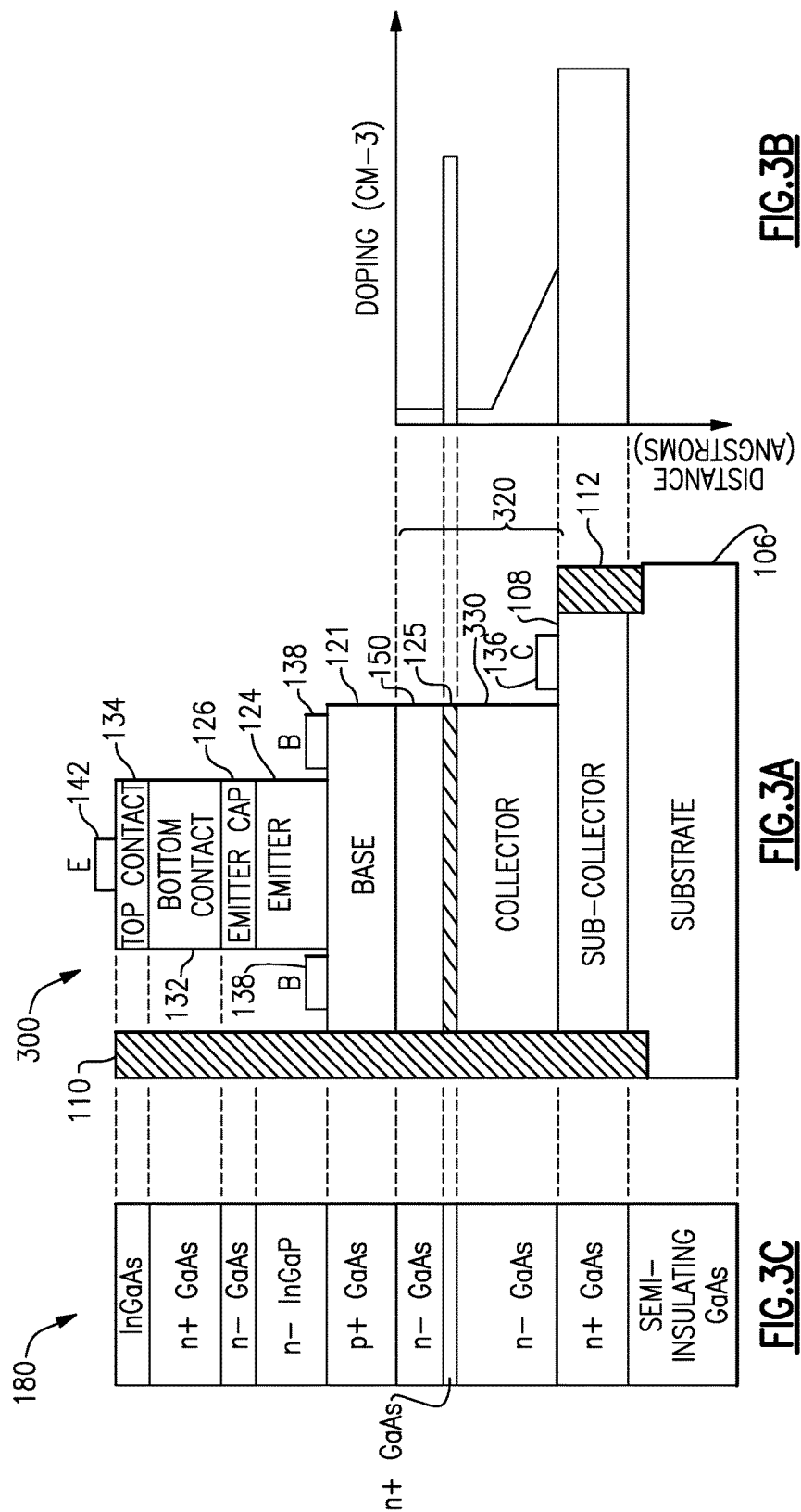

METHODS OF FORMING A BIPOLAR TRANSISTOR HAVING A COLLECTOR WITH A DOPING SPIKE

RELATED APPLICATIONS

This application is a continuation of U.S. patent application Ser. No. 15/197,611, filed Jun. 29, 2016, titled "BIPOLAR TRANSISTOR HAVING COLLECTOR WITH DOPING SPIKE," which is a continuation of Ser. No. 14/720,519, filed May 22, 2015, titled "BIPOLAR TRANSISTOR HAVING COLLECTOR WITH DOPING SPIKE," which is a continuation of U.S. patent application Ser. No. 13/870,682, filed Apr. 25, 2013, titled "BIPOLAR TRANSISTOR HAVING COLLECTOR WITH DOPING SPIKE," which claims the benefit of priority under 35 U.S.C. § 119(e) of U.S. Provisional Patent Application No. 61/639,784, filed Apr. 27, 2012, titled "BIPOLAR TRANSISTOR HAVING COLLECTOR WITH DOPING SPIKE," the disclosures of each of which are herein incorporated by reference in their entireties.

BACKGROUND

Technical Field

The present disclosure relates to the field of semiconductor structures and, more particularly, to bipolar transistors and products that include bipolar transistors.

Description of the Related Technology

Bipolar transistors, such as heterojunction bipolar transistors (HBTs), are implemented in a wide variety of applications. Such bipolar transistors can be formed on semiconductor substrates, such as gallium arsenide (GaAs) substrates. One illustrative application for a bipolar transistor is in a power amplifier system. Specifications for power amplifier systems have become more demanding to meet.

One aspect of transistor performance is linearity. Linearity can also be a measure of performance of a power amplifier system. Measures of linearity performance can include channel power ratios, such as an adjacent channel power ratio (ACPR1) and an alternative channel power ratio (ACPR2), and/or channel leakage power ratios, such as an adjacent channel leakage power ratio (ACLR1) and an alternative channel leakage power ratio (ACLR2). ACPR2 and ACLR2 can be referred to as second channel linearity measures. ACPR2 and ACLR2 values can correspond at measurements at an offset of about 1.98 MHz from a frequency of interest.

Another aspect of transistor and/or power amplifier system performance is safe operating area (SOA). SOA can be determined from a breakdown voltage of a transistor, such as $BV_{CEO}$. $BV_{CEO}$ can represent a breakdown voltage from collector to emitter with an open circuit at the base. $BV_{CEO}$ can be a direct current (DC) measurement.

A need exists for transistors with improved linearity and/or SOA in a variety of systems, such as power amplifier systems.

SUMMARY OF CERTAIN INVENTIVE ASPECTS

The innovations described in the claims each have several aspects, no single one of which is solely responsible for its desirable attributes. Without limiting the scope of the claims, some prominent features will now be briefly described.

One aspect of this disclosure is a bipolar transistor that includes a collector, a base disposed over the collector, and an emitter. The collector has a collector width between a first end and a second end opposite the first end. The base abuts the first end of the collector at a base-collector junction. The collector has a doping spike disposed closer to the base-collector junction than to the second end of the collector.

In certain embodiments, the doping spike is at a homo-junction of the bipolar transistor. According to some embodiments, the doping spike is disposed at a location that results in approximately a local maximum of $BV_{CEO}$ of the bipolar transistor. The doping spike is configured to improve second channel linearity of the bipolar transistor without substantially degrading $BV_{CEO}$ of the bipolar transistor, according to a number of embodiments.

The doping spike is disposed within about ⅓ of the collector width from the base-collector junction in a number of embodiments. The doping spike is disposed within about 3/10 of the collector width from the base-collector junction according to various embodiments. In some embodiments, the doping spike is disposed within about ¼ of the collector width from the base-collector junction. The doping spike is disposed within about ⅛ of the collector width from the base-collector junction according to certain embodiments. The doping spike is disposed within about 1/10 of the collector width from the base-collector junction in some embodiments.

The doping spike is disposed within about 0.5 µm from the base-collector junction in certain embodiment. According to some embodiments, the doping spike is disposed within about 0.3 µm from the base-collector junction. In various embodiments, the doping spike is disposed within about 0.2 µm from the base-collector junction. The doping spike is disposed within about 0.15 µm from the base-collector junction in a number of embodiments. According to certain embodiments, the doping spike is disposed within about 0.1 µm from the base-collector junction.

In accordance with certain embodiments, the doping spike has a doping concentration of at least about $2 \times 10^{17}$ cm$^{-3}$. The doping spike has a doping concentration of at least about $1 \times 10^{18}$ cm$^{-3}$ in some embodiments.

The doping spike has thickness of no more than about 200 Å according to a number of embodiments.

The base has a substantially flat doping in certain embodiments.

According to various embodiments, the collector further includes a grading that begins at a point farther from the base-collector junction than the doping spike.

The collector has a substantially flat doping besides the doping spike according to certain embodiments. In some of these embodiments, the substantially flat doping has a doping concentration that is at least one order of magnitude less than the doping concentration of the doping spike. In accordance with various embodiments, the substantially flat doping has a doping concentration that is at least two orders of magnitude less than the doping concentration of the doping spike. The substantially flat doping has a doping concentration selected from the range from about $7 \times 10^{15}$ cm$^{-3}$ to $3 \times 10^{16}$ cm$^{-3}$ according to a number of embodiments.

The bipolar transistor also includes a sub-collector abutting the second end of the collector according to some embodiments.

The doping spike is configured to improve ACPR2 without substantially degrading a breakdown voltage of the bipolar transistor in certain embodiments.

In some embodiments, a thickness of the collector region is selected from a range of about 3000 Å to 11000 Å.

The bipolar transistor is a single heterojunction bipolar transistor (HBT) according to certain embodiments.

According to certain embodiments, the bipolar transistor is a GaAs transistor. In some other embodiments, the bipolar transistor is a SiGe transistor.

Another aspect of this disclosure is a power amplifier module that includes a power amplifier. The power amplifier is configured to receive a radio frequency (RF) signal and generate an amplified RF signal from the received RF signal. The power amplifier includes a bipolar transistor having a collector, a base abutting the collector at a base-collector junction, and an emitter. The collector has a collector thickness from the base-collector junction to an opposing end of the collector. The collector includes a doping spike located within half of the collector thickness from the base-collector junction.

In certain embodiments, the doping spike is at a homojunction of the bipolar transistor.

According to some embodiments, the collector includes a grading farther from the base-collector junction than the doping spike.

The doping spike is located within about ¼ of the collector thickness from the base-collector junction in a number of embodiments. The doping spike is located within about 1/10 of the collector thickness from the base-collector junction according to some embodiments. The doping spike is located within about 0.2 μm from the base-collector junction in accordance with various embodiments. The doping spike is located within about 0.5 μm from the base-collector junction in certain embodiments.

According to some embodiments, the doping spike has a doping concentration on the order of at least about $1 \times 10^{17}$ cm$^{-3}$.

The doping spike has thickness of no more than about 150 Å in various embodiments.

The bipolar transistor is a single heterojunction bipolar transistor according to a number of embodiments.

According to certain embodiments, the doping spike is configured to improve second channel linearity.

Another aspect of this disclosure is a power amplifier die that includes a bipolar transistor. The bipolar transistor has a collector, a base abutting the collector, and an emitter. The collector has a doping spike at a homojunction within about 0.5 μm of an interface between the base and the collector.

Another aspect of this disclosure is a mobile device that includes an antenna, a battery, and a power amplifier. The power amplifier includes a heterojunction bipolar transistor having a collector with a collector thickness, a base, and an emitter. The collector includes a first collector region abutting the base and having a doping spike within about ⅓ of the collector thickness from an interface of the base and the collector. The doping spike is configured to improve second channel linearity of the power amplifier.

Yet another aspect of this disclosure is a method of forming a bipolar transistor. The method includes depositing a portion of a collector of the bipolar transistor on a sub-collector of the bipolar transistor, doping another portion of the collector to form a doping spike in the collector, and forming a base of the bipolar transistor such that the doping spike in the collector is within about half of a collector thickness of the interface between the collector and the base.

For purposes of summarizing the disclosure, certain aspects, advantages and novel features of the inventions have been described herein. It is to be understood that not necessarily all such advantages may be achieved in accordance with any particular embodiment of the invention. Thus, the inventions may be embodied or carried out in a manner that achieves or optimizes one advantage or group of advantages as taught herein without necessarily achieving other advantages as may be taught or suggested herein.

BRIEF DESCRIPTION OF THE DRAWINGS

FIG. 1A depicts an illustrative cross section of a bipolar transistor according to an embodiment.

FIG. 1B is a graph of example doping concentrations of portions of the bipolar transistor of FIG. 1A.

FIG. 1C is a legend illustrating example materials corresponding to portions of the bipolar transistor of FIG. 1A.

FIG. 2A is a graph that illustrates relationships between current density and collector-emitter voltage for various spike locations in GaAs transistors.

FIG. 2B is a graph that illustrates relationships between current density and collector-emitter voltage for various spike doping concentrations in GaAs transistors.

FIG. 3A depicts an illustrative cross section of a bipolar transistor according to another embodiment.

FIG. 3B is a graph of example doping concentrations of portions of the bipolar transistor of FIG. 3A.

FIG. 3C is a legend illustrating example materials corresponding to portions of the bipolar transistor of FIG. 3A.

DETAILED DESCRIPTION OF SOME EMBODIMENTS

Figure 2C:
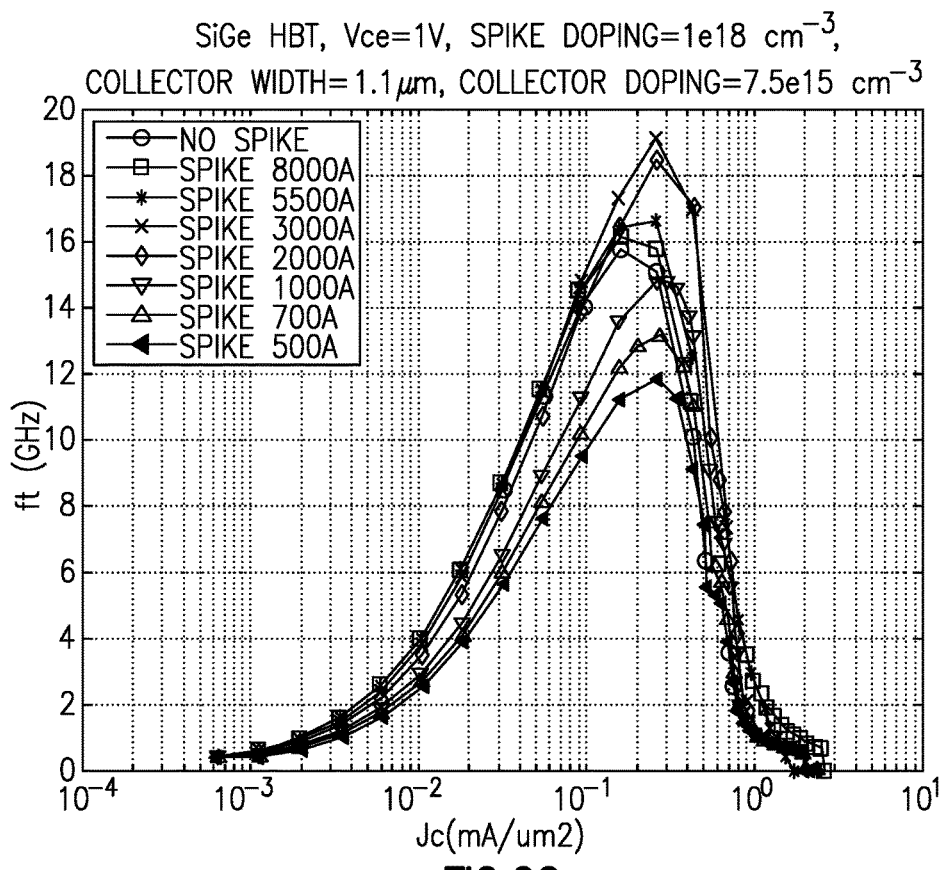
FIGS. 2C-2F are graphs that illustrate relationships between cut-off frequency and current density for various spike locations in SiGe transistors and relationships between current density and collector-emitter voltage for various spike doping concentrations in SiGe transistors.
Figure 2D:
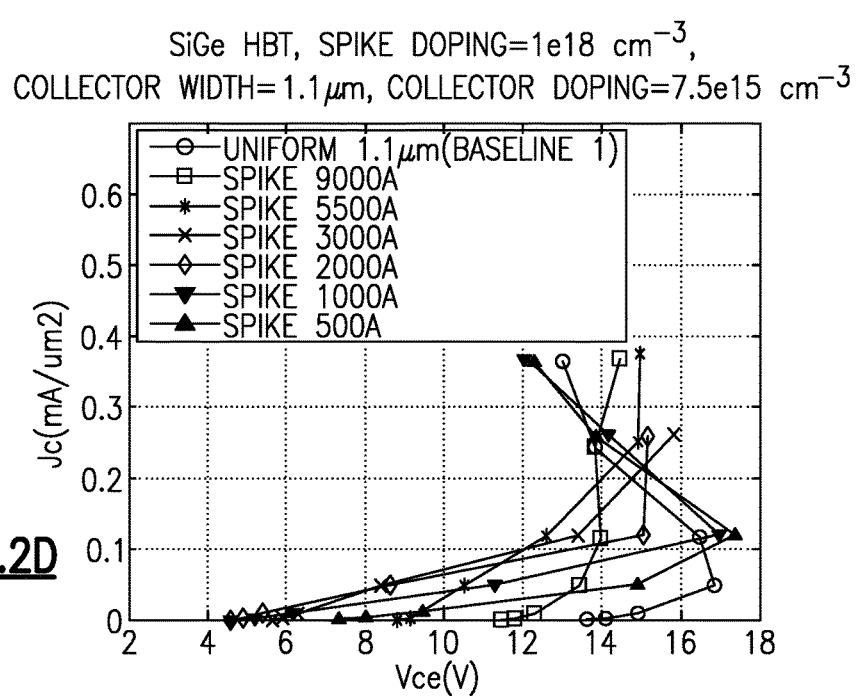

Generally described, aspects of the present disclosure relate to a bipolar transistor having a doping spike in the collector relatively close to the base-collector junction. The doping spike in the collector can be disposed so as to improve linearity, such as second channel linearity, while substantially maintaining the breakdown voltage $BV_{CEO}$ of the bipolar transistor. The doping spike can be disposed at a location that results in approximately a local maximum breakdown voltage $BV_{CEO}$ of the bipolar transistor. The doping spike can be at a homojunction of the bipolar transistor. Bipolar transistors with one or more features of the doping spikes described herein can be implemented in a power amplifier system.

Certain placements of a doping spike in the collector of a bipolar transistor can decrease $BV_{CEO}$ while improving ruggedness of the bipolar transistor. These placements of the doping spike have not shown improvement in the linearity of the bipolar transistor.

There have also been observed drawbacks to including a doping spike in the collector of a bipolar transistor near the base-collector junction. For instance, certain placements of the doping spike in the collector near the base-collector junction can degrade gain of the bipolar transistor. Alternatively or additionally, a doping spike can create issues related to changes in capacitance in the collector compared to including a different doping profile in a wider area of the collector. Such capacitance can degrade RF gain in certain circumstances.

Experimental data indicate that placing a doping spike in the collector near the base-collector junction can improve second channel linearity, such as ACPR2. In particular, single heterojunction bipolar transistors (single HBTs) have shown improvement in ACPR2 as a result of including a doping spike in the collector near a base-collector interface.

Additionally, previous data on doping spikes, for example, from lo-hi-lo IMPATT diodes, show a monotonic decrease in break down voltage as the doping spike in the collector is moved closer to the base-collector junction. However, as described herein, the inventors have appreciated that placement of the doping spike relative to the base-collector junction can result in the break down voltage varying non-monotonically. In particular, the inventors have appreciated that break down voltage can reach a maximum and then decrease at certain placements of the doping spike in the collector near the base-collector junction.

Including a doping spike at a homojunction of the collector in such placements can improve linearity, such as second channel linearity, without substantially reducing breakdown voltage, such as $BV_{CEO}$. As one example, including a doping spike within about 1000 Å of a base-collector junction in a collector having a total collector thickness of about 1.1 um shows improved ACPR2 while maintaining $BV_{CEO}$. In this example, the doping spike has shown improved alternating current (AC) performance.

Experimental data indicate that a doping spike in a collector can cause a relatively large drop of an electric field at the location of the spike. After the peak electric field exceeds a threshold level for impact ionization to occur, as the collector current increases, the peak electric field (and thus the breakdown region) appears to shift toward a sub-collector on an opposite side of the collector than the base. This can be inferred, for example, from an electric field profile and impact ionization rate plots. Compared to other collector doping profiles (for example, a step doped collector), the collector with a doping spike also appears to allow the electric field to punch through. Data indicate that the doping spike can provide an "extra" region between the doping spike and the sub-collector for a depletion layer to expand or for the electric field to build up, or the $V_{CB}$ to increase before snap back occurs. This can result in a larger $BV_{CEX}$ for a collector that includes a doping spike. However, this "extra" region can get smaller as the doping spike is placed closer to the sub-collector. As a result, the $BV_{CEX}$ of a transistor that includes the doping spike near the sub-collector may not improve.

FIG. 1A shows an illustrative cross section of a bipolar transistor 100 according to an embodiment. As illustrated, the bipolar transistor 100 is a heterojunction bipolar transistor (HBT). The bipolar transistor 100 can be formed on a substrate 106. The substrate 106 can be a semiconductor substrate, such as a GaAs substrate or a Si substrate. The bipolar transistor 100 can be disposed between isolation regions 110 and 112. Isolation regions 110 and 112 are non-conductive regions that can provide electrical isolation between the bipolar transistor 100 and an adjacent transistor or other circuit element. Isolation regions 110 and 112 can each include, for example, a trench filled with nitride, polyimide, or other material suitable for electrical isolation.

The bipolar transistor 100 can include a collector 120, a base 121, and an emitter 124. A first end of the collector 120 can abut the base 121. This can form a base-collector junction. The base-collector junction can be a p-n junction. The collector 120 can include, for example, N− doped GaAs at the interface with the base 121. A second end of the collector 120 that is opposite the first end can abut the sub-collector 108. A thickness of the collector 120 can represent the distance from the first end of the collector to the second end of the collector. The collector thickness can also equivalently be referred to as the collector width. In the bipolar transistor 100 illustrated in FIG. 1A, the collector thickness can be the distance from the interface between the collector 120 and the base 121 and the interface between the collector 120 and the sub-collector 108. In certain embodiments, the thickness of the collector 120 can be selected from the range of about 0.3 μm to 1.1 μm, such as from or about 0.5 μm to 1.1 μm.

The collector 120 can include a doping spike 125. The collector 120 can also include a flat doped portion 150 outside of the doping spike 125. As illustrated in FIG. 1A, the flat doped portion 150 of the collector region 120 can include all or substantially all of the collector 120 outside of the doping spike 125. The flat doped portion 150 can include N− doped GaAs and the doping spike can include N+ doped GaAs. Alternatively, in some other embodiments (not shown), flat doped portion 150 can include P− doped GaAs and the doping spike can include P+ doped GaAs. The flat doped portion 150 can have a substantially flat doping. The doping concentration in the flat doped portion 150 can be at least about one, two, or three orders of magnitude less than the doping concentration in the doping spike 125. In some embodiments, the flat doped portion 150 can have a doping concentration selected in the range from about $7 \times 10^{15}$ cm$^{-3}$ to $1 \times 10^{16}$ cm$^{-3}$.

The doping spike 125 is relatively thin. In the bipolar transistor 100 illustrated in FIG. 1A, the thickness of the doping spike 125 can be measured in a direction substantially parallel to the base-collector junction. In certain embodiments, the doping spike 125 can have a non-zero thickness of less than or equal to about 200 Å, 150 Å, 100 Å, or 50 Å. For instance, the doping spike 125 can have a thickness of about 100 Å.

The doping spike 125 can be disposed so as to improve second channel linearity of the bipolar transistor 100 and to not degrade $BV_{CEO}$. For instance, the doping spike 125 can be disposed at or near a location that results in a local maximum of $BV_{CEO}$ of the transistor 100. The placement of the doping spike 125 can improve $BV_{CEX}$ while improving second channel linearity and without substantially degrading $BV_{CEO}$. The doping spike can be disposed to improve large signal linearity of the bipolar transistor 100. As illustrated in FIG. 1A, the doping spike 125 is relatively close to the base-collector junction. The doping spike 125 can be closer to the first end of the 120 at the base-collector junction than the second end of the collector 120 that is opposite the first end of the collector (for example, the interface with the sub-collector 108 in the embodiment illustrated in FIG. 1A). In certain embodiments, the doping spike 125 is disposed within about ½ of the collector width from the base-collector junction, within about ⅖ of the collector width from the base-collector junction, within about ⅓ of the collector width from the base-collector junction, within about 3/10 of the collector width from the base-collector junction, within about 3/11 of the collector width from the base-collector junction, within about ¼ of the collector width from the base-collector junction, within about ⅕ of the collector width from the base-collector junction, within about ⅙ of the collector width from the base-collector junction, within about ⅛ of the collector width from the base-collector junction, or within about 1/10 of the collector width from the base-collector junction. In some embodiments, the doping spike 125 can be disposed within about 0.5 μm from the base-collector junction, within about 0.45 μm from the base-collector junction, within about 0.4 μm from the base-collector junction, within about 0.35 μm from the base-collector junction, within about 0.3 μm from the base-collector junction, within about 0.25 μm from the base-collector junction, within about 0.2 μm from the base-collector junction, within about 0.15 μm from the base-collector junction, within about 0.12 μm from the base-collector junction, within about 0.1 μm from the base-collector junction, or within about 0.05 μm from the base-collector junction. As one example, the doping spike 125 can be disposed about 0.1 μm (1000 Å) from the base-collector junction of the bipolar transistor 100. As another example, the doping spike 125 can be disposed about 0.3 μm (3000 Å) from the base-collector junction of the bipolar transistor 100. One or more of the doping spike placements described in this paragraph can apply to any of the bipolar transistors described herein, such as GaAs bipolar transistors or SiGe bipolar transistors.

The curves illustrated in FIG. 2A correspond to placements of a doping spike at various distances from a base-collector junction of the bipolar transistor 100 having a collector 120 with a thickness of 1.1 μm and a flat doping of approximately $7.5 \times 10^{15}$ cm$^{-3}$ outside of the doping spike 125.

The doping spike 125 can have a relatively high doping concentration. For example, as indicated by the legend 180, the doping spike 125 can be N+ doped. Since the doping spike 125 is N+ doped and the reminder of the collector 120 is N− doped, the doping spike 125 is at a homojunction of the bipolar transistor 100 illustrated in FIG. 1A. In some other embodiments, the doping spike 125 can be P+ doped. According to some of these embodiments, the remainder of the collector 120 can be P− doped.

In some embodiments, the doping concentration of the doping spike 125 can be selected from the range from about $1 \times 10^{17}$ cm$^{-3}$ to $1 \times 10^{19}$ cm$^{-3}$. According to certain embodiments, the doping concentration of the doping spike 125 can be selected from one of the following ranges: from about $2 \times 10^{17}$ cm$^{-3}$ to $1 \times 10^{18}$ cm$^{-3}$, from about $2 \times 10^{17}$ cm$^{-3}$ to $1.5 \times 10^{18}$ cm$^{-3}$, from about $2 \times 10^{17}$ cm$^{-3}$ to $2 \times 10^{18}$ cm$^{-3}$, from about $2 \times 10^{17}$ cm$^{-3}$ to $2.5 \times 10^{18}$ cm$^{-3}$ from about $2 \times 10^{17}$ cm$^{-3}$ to $3 \times 10^{18}$ cm$^{-3}$, from about $2 \times 10^{17}$ cm$^{-3}$ to $5 \times 10^{18}$ cm$^{-3}$, or from about $2 \times 10^{17}$ cm$^{-3}$ to $6 \times 10^{18}$ cm$^{-3}$. In accordance with some embodiments, the doping concentration of the doping spike 125 can be at least about $1 \times 10^{17}$ cm$^{-3}$, $2 \times 10^{17}$ cm$^{-3}$, $5 \times 10^{17}$ cm$^{-3}$, $7 \times 10^{17}$ cm$^{-3}$, $1 \times 10^{18}$ cm$^{-3}$, $1.5 \times 10^{18}$ cm$^{-3}$, $2 \times 10^{18}$ cm$^{-3}$, $2.5 \times 10^{18}$ cm$^{-3}$, $3 \times 10^{18}$ cm$^{-3}$, $4 \times 10^{18}$ cm$^{-3}$, $5 \times 10^{18}$ cm$^{-3}$, $7 \times 10^{18}$ cm$^{-3}$, or $1 \times 10^{19}$ cm$^{-3}$. As one example, the doping concentration of the doping spike 125 can be approximately $2 \times 10^{18}$ cm$^{-3}$. One or more of the spike doping concentrations described in this paragraph can apply to any of the bipolar transistors described herein, such as GaAs bipolar transistors or SiGe bipolar transistors.

FIG. 2B is a graph that illustrates relationships between current density and collector-emitter voltage for various concentrations of a doping spike of a bipolar transistor. The curves illustrated in FIG. 2B correspond to different doping concentrations of a doping spike 125 spaced 3000 Å from a base-collector junction of the bipolar transistor 100 having a collector 120 with a thickness of 1.1 μm and a flat doping of approximately $7.5 \times 10^{15}$ cm$^{-3}$ outside of the doping spike 125. The current-voltage curves illustrated in FIG. 2B appear to start shifting to the right for doping spikes with a concentration below about $2 \times 10^{18}$ cm$^{-3}$. When the curves shift right, this can result in a higher $BV_{CEO}$ and higher $BV_{CEX}$ but lower collector current for $BV_{CEX}$. This appears to show that as the doping concentration of the doping spike is decreased, it becomes easier for the electric field to punch through the doping spike. For instance, lower doping concentrations should be closer to a uniform doped collector with a higher $BV_{CEO}$.

Referring back to FIG. 1A, the base 121 of the bipolar transistor 100 can include P doped GaAs (for example, P+ doped GaAs). The base 121 can have a substantially flat doping. The bipolar transistor 100 can include a collector contact 136 to the collector 120, base contact(s) 138 to the base 121, and an emitter contact 142 to the emitter 126. These contacts can provide an electrical connection to and/or from the bipolar transistor 100. The contacts 136, 138, and 142 can be formed of any suitable conductive material. As illustrated in FIG. 1A, the emitter contact 142 can be disposed over a top contact 134, a bottom contact 132, and an emitter cap 126.

The bipolar transistor 100 can include a sub-collector 108 over the substrate 106. The sub-collector 108 can be under the collector 120. As illustrated in FIG. 1A, the sub-collector 108 can be disposed between the collector 120 and the substrate 106. The sub-collector 108 can abut the second end of the collector 120. The sub-collector 108 can be a flat doped region. The sub-collector 108 can have a doping concentration on the order of $1 \times 10^{18}$ cm$^{-3}$, such as about $5 \times 10^{18}$ cm$^{-3}$. The sub-collector 108 can have a thickness of about 8000 Å in certain embodiments. The collector contact 136 can physically contact the sub-collector 108 to provide an electrical connection to the collector 120.

FIG. 1C is a legend 180 illustrating example materials corresponding to portions of the bipolar transistor 100 of FIG. 1A. Dashed lines between FIG. 1A and FIG. 1C are included to indicate that materials in the legend 180 correspond to particular portions of the bipolar transistor 100. The legend 180 indicates that, in certain embodiments, the substrate 106 can be semi-insulating GaAs, the sub-collector 108 can be N+ GaAs, the flat doped portion 150 of the collector 150 can be N− GaAs, the doping spike 125 can be N+ GaAs, the base 121 can be P+ GaAs, the emitter 124 can be N− InGaP, the emitter cap 126 can be N− GaAs, the bottom contact 132 can be N+ GaAs, and the top contact 134 can be InGaAs.

It will be understood that in some embodiments, one or more of the regions of the bipolar transistor 100 can include a suitable alternative material instead of the example materials provided in the legend 180. For example, in certain embodiments, the substrate 106 can be SiGe and one or more other regions of the bipolar transistor 100 can also include Si and/or SiGe. If a doping spike 125 is implemented in a SiGe bipolar transistor, then the gain of such transistors should improve as a result of including the doping spike 125 relatively near the base-collector junction, for example, as described with reference to FIG. 1A. This should result improvement in RF gain of a power amplifier that includes such a SiGe bipolar transistor.

Moreover, in any of the bipolar transistors described herein n-type doping and p-type doping can be interchanged throughout some or all of the transistor. Thus, any combination of features described herein can be applied to NPN transistors and/or PNP transistors.

FIGS. 2C-2F are graphs that illustrate relationships between cut-off frequency and current density for various spike locations in SiGe transistors and relationships between current density and collector-emitter voltage for various spike doping concentrations in SiGe transistors. The data in FIGS. 2C-2F corresponds to a SiGe embodiment of the transistor 100 of FIG. 1A with the doping profile shown in FIG. 1B. The graphs in FIGS. 2C-2D correspond to SiGe transistors with a collector width of 1.1 μm collector width, in which the collector has a doping spike with a doping concentration of $1 \times 10^{18}$ cm$^{-3}$ with the reminder of the collector having a flat doping concentration of $7.5 \times 10^{15}$ cm$^{-3}$. The graphs in FIGS. 2E-2F correspond to SiGe transistors with a collector width of 0.5 μm, in which the collector has a doping spike with a doping concentration of $1 \times 10^{18}$ cm$^{-3}$ with the reminder of the collector having a flat doping concentration of $7.5 \times 10^{15}$ cm$^{-3}$. The data in FIGS. 2C and 2E corresponds to a voltage between the collector and the emitter of 1 V. The SiGe transistors corresponding to the data in FIGS. 2C-2F can have improved large signal linearity.

Simulation data indicate that, in general, the closer a doping spike is disposed to the base of a SiGe bipolar transistor, the lower the $BV_{CEO}$. But when the spike is positioned too close to the base, the breakdown curve can shift toward a higher $V_{CE}$ region. The doping spike location where this occurs can depend on the doping concentration of the doping spike. Based on simulation data, this may occur for a doping spike with a doping concentration of $1 \times 10^{18}$ cm$^{-3}$ in a SiGe bipolar transistor and may not occur for a doping spike with doping spike with a doping concentration of $2 \times 10^{18}$ cm$^{-3}$ in a SiGe bipolar transistor. This may result from the magnitude of the electric field peaking at base-collector junction and decreasing towards the collector-sub-collector interface. Therefore, the closer the spike is to base-collector junction and/or the lower the spike doping is, the easier the spike can punch through (i.e., the doping spike can become "transparent" to the breakdown).

As shown in FIG. 2C, peak cut-off frequency ft can increase the position of the doping spike is moved from 8000 Å away from the base to 3000 Å away from the base in a collector with a width of 11000 Å. Moving the doping spike closer to the base can be like shortening the collector. This can reduce collector transit time. But moving the doping spike closer than 3000 Å from the base-collector junction can start reducing the peak cut-off frequency ft as the doping spike get punched through ($BV_{CEO}$ starts increasing). Also, capacitance from the base to the collector $C_{BC}$ can increase as the doping spike is placed closer to the base. Low current density cut-off frequency ft can degrade. Overall, the doping spike appears to have higher current density at peak cut-off frequency ft than the baseline. The doping spike can be more effective at delaying the Kirk effect.

Simulation data indicate that the lower the spike doping, the larger the $BV_{CEO}$ is as the doping spike is moved close to the base (for example, 700 Å from the base or 500 Å from the base).

Figure 2E:
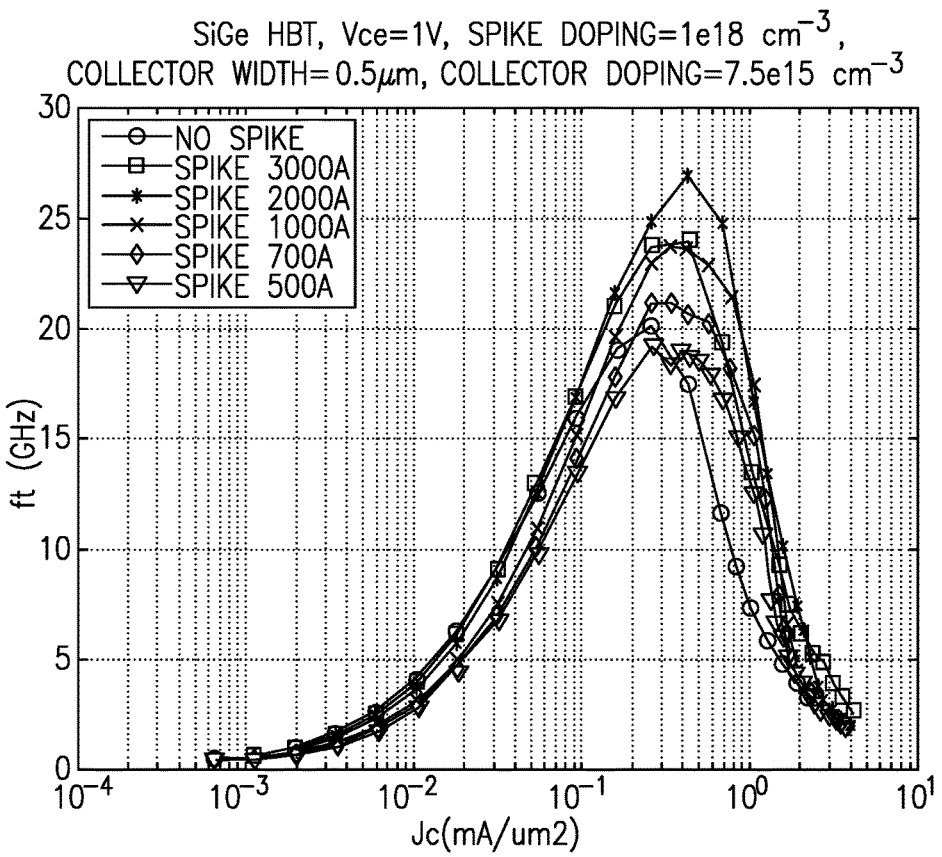
Figure 2F:
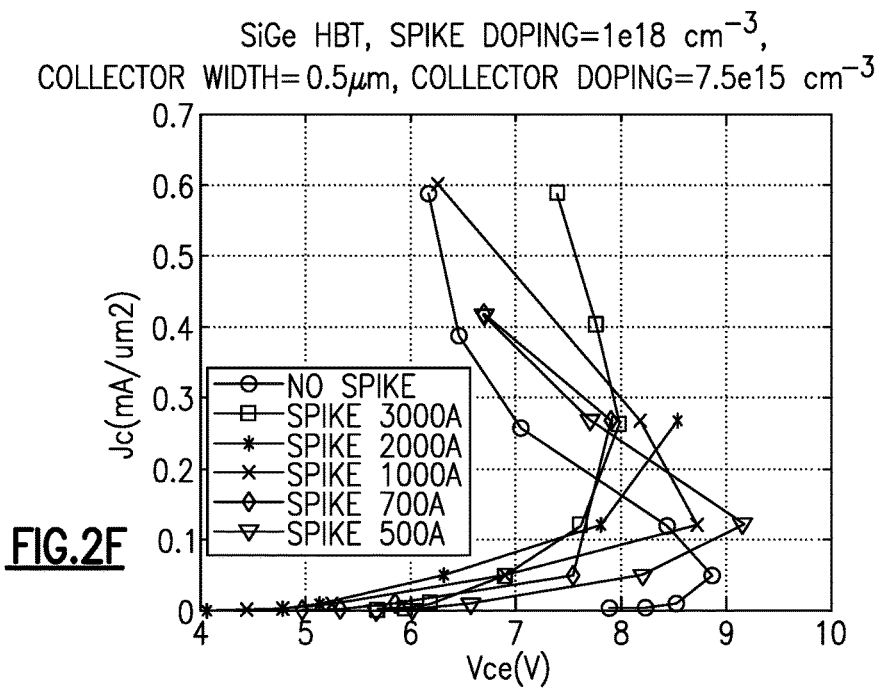

As shown in FIG. 2E, peak cut-off frequency ft can increase as the doping spike is moved from 3000 Å away from the base to 2000 Å away from the base in a collector with a width of 5000 Å. Moving the doping spike closer to the base can be like shortening the collector. This can reduce collector transit time. But moving the doping spike closer than 2000 Å from the base can start reducing the peak cut-off frequency ft as the doping spike get punched through ($BV_{CEO}$ starts increasing). Also, capacitance from the base to the collector $C_{BC}$ can increase as the doping spike is placed closer to the base. Low current density cut-off frequency ft can degrade. Overall, the doping spike appears to have higher current density at peak cut-off frequency ft than the baseline. The doping spike can be more effective at delaying the Kirk effect.

FIG. 3A depicts an illustrative cross section of a bipolar transistor 300 according to another embodiment. The bipolar transistor 300 of FIG. 3A is substantially the same as the bipolar transistor 100 of FIG. 1A except the doping in the collector 320 of FIG. 3A is different from the doping of the collector 120 of FIG. 1A. More specifically, the collector 320 includes a grading. FIG. 3B is a graph that shows illustrative doping concentrations of portions of the bipolar transistor 300 of FIG. 3A.

The bipolar transistor 300 can include a collector 320 having a doping spike 125, a flat doped portion 150, and a graded portion 330. The doping spike 125 and the flat doped portion 150 can include any combination of features described with reference to the doping spike 125 and the flat doped portion 150 described with references to FIGS. 1A-1C.

The graded portion 330 of the collector 320 includes a grading in which doping concentration varies (for example, increases) away from the base 121. Doping concentration can vary linearly or non-linearly (for example, parabolically) in the grading. For example, FIG. 3B illustrates a linear grade in doping concentration in the graded portion 330. The grading in the graded portion 330 can be farther from the base 121 than the doping spike 125. For example, as illustrated in FIG. 3A, the grading in the graded portion 330 can be disposed between the doping spike 125 and the sub-collector 108. The doping concentration in the grading in the graded portion 330 can increase away from doping spike 125. In one embodiment, the doping concentration can grade from about $3 \times 10^{16}$ cm$^{-3}$ to about $6 \times 10^{16}$ cm$^{-3}$ at an interface with the sub-collector 108. According to some other embodiments (not shown), the graded portion 300 can include two or more gradings in which doping concentration varies (for example, increases away from the base 121) at different rates.

The grading in the graded portion 330 can extend to an interface with the sub-collector 108 according to certain embodiments. In some of these embodiments, the maximum doping concentration of the graded portion 330 can be about two orders of magnitude lower than the doping concentration of the sub-collector 108. For example, the maximum doping concentration of the graded portion 330 can be about $6 \times 10^{16}$ cm$^{-3}$ and the doping concentration of the sub-collector 108 can be about $5 \times 10^{18}$ cm$^{-3}$.

The doping concentration of the collector 120 at an interface with the sub-collector 108 can determine a breakdown voltage from collector to emitter with the base to a potential via a resistor. Such a breakdown voltage can be referred to as "$BV_{CEX}$." A higher $BV_{CEX}$ can increase a safe operating area (SOA) and/or ruggedness of a bipolar transistor. Higher doping in the graded portion 330 at the interface with the sub-collector 108 can reduce the SOA. Doping the graded portion 330 at the interface with the sub-collector 108 too low can result in a breakdown current that is too steep, thereby reducing robustness of the bipolar transistor 300. In certain embodiments, the doping concentration in the graded portion 330 at the interface with the sub-collector 108 can be selected in the range from about $5 \times 10^{16}$ cm$^{-3}$6 to $9 \times 10^{16}$ cm$^{-3}$. Such doping concentrations can result in desirable $BV_{CEX}$ values for the bipolar transistor 300 and/or a desirable SOA.

According to other embodiments (not shown), the collector can include a relatively high doping at an interface with the base. The relatively high doping can be at least about $3 \times 10^{16}$ cm$^{-3}$. For instance, the relatively high doping can be selected from the range of about $3 \times 10^{16}$ cm$^{-3}$ to $9 \times 10^{16}$ cm$^{-3}$. Having a relatively high doping in the collector at an interface with the base can improve linearity, such as second channel linearity.

Figure 4:
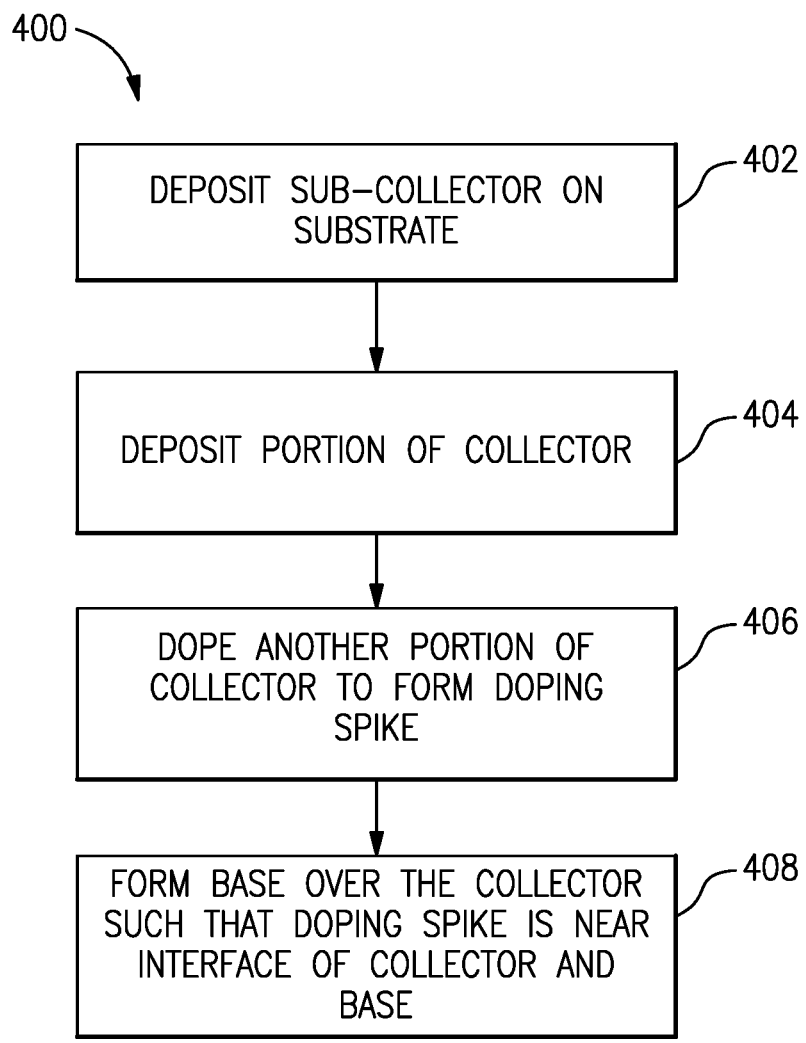
FIG. 4 is an illustrative flow diagram of making a bipolar transistor according to an embodiment.

FIG. 4 is an illustrative flow diagram of a process 400 of forming a bipolar transistor according to an embodiment. The process 400 can be performed while forming the bipolar transistor 100 of FIG. 1A and/or the bipolar transistor 300 of FIG. 3A. As such, the process 400 can form a variety of different types of bipolar transistors, such as GaAs bipolar transistors and/or SiGe bipolar transistors. At block 402, a sub-collector is formed over a substrate. The sub-collector can include any combination of the sub-collectors described herein, for example, the sub-collector 108. A portion of the collector can be formed (for example, deposited) block 404. At block 406, another portion of the collector can be doped to form a doping spike. The doping spike can include one or more features of the doping spikes described herein. After forming the doping spike, additional collector can be formed over the doping spike. When the collector is fully formed, the collector has a collector thickness, which can be any of the collector thicknesses described herein. It will be understood that the collector thickness does not include the thickness of the sub-collector. The base of a bipolar transistor is formed at block 408. The base can include any combination of features of the bases described herein, for example, the base 121. For instance, the base can abut the collector. The base can be formed such that the doping spike in the collector is near the interface of the base and the collector.

In a bipolar transistor formed by the process 400, the doping spike can be spaced from the base by any of the ratios and/or distances described herein. For instance, the doping spike can be formed within about half of the collector thickness of the interface between the collector and the base. The doping spike can be formed at a location of the collector that results in substantially a maximum breakdown voltage of the bipolar transistor. The doping spike can be formed at a position in the collector near the collector-base interface such that linearity, such as APCR2, is improved without substantially decreasing break down voltage, such as $BV_{CEO}$. In some embodiments, the collector can also be doped to form a grading in the collector that is farther from the base than the doping spike. The spiked doping in the collector can improve AC performance of the bipolar transistor. Alternatively or additionally, the spiked doping can improve RF performance of the bipolar transistor.

It will be understood that any of the processes discussed herein, such as the process 400, may include greater or fewer operations and the operations may be performed in any order, as appropriate. For example, in some Si bipolar transistors 100 and/or 300, the base may be formed prior to forming the collector and the doping spike can be formed after forming the base. Further, one or more acts of the processes discussed herein, such as the process 400, can be performed either serially or in parallel.

Figure 5:
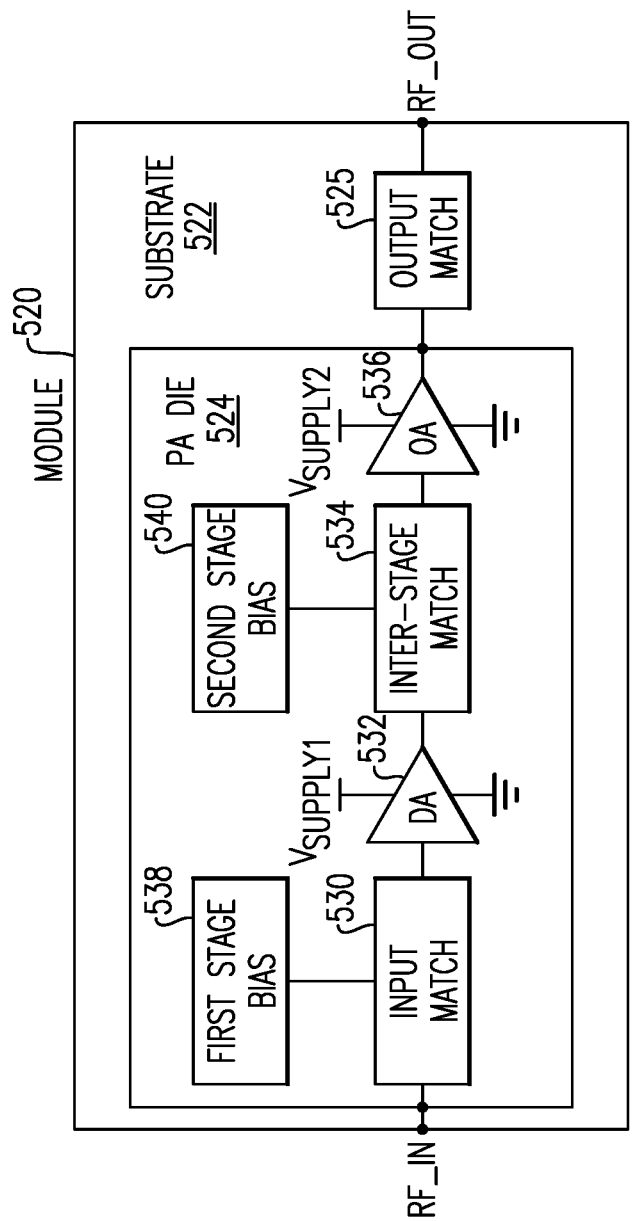
FIG. 5 is an illustrative block diagram of a power amplifier module that includes a bipolar transistor with one or more features described herein.

FIG. 5 is a schematic block diagram of a module 520 that can include one or more bipolar transistors 100 of FIG. 1A and/or one or more bipolar transistors 300 of FIG. 3. The module 520 can be some or all of a power amplifier system. The module 520 can be referred to as multi-chip module and/or a power amplifier module in some implementations. The module 520 can include a substrate 522 (for example, a packaging substrate), a die 524 (for example, a power amplifier die), a matching network 525, the like, or any combination thereof. Although not illustrated, the module 520 can include one or more other dies and/or one or more circuit elements that coupled to the substrate 522 in some implementations. The one or more other dies can include, for example, a controller die, which can include a power amplifier bias circuit and/or a direct current-to-direct current (DC-DC) converter. Example circuit element(s) mounted on the packaging substrate can include, for example, inductor(s), capacitor(s), impedance matching network(s), the like, or any combination thereof.

The module 520 can include a plurality of dies and/or other components mounted on and/or coupled to the substrate 522 of the module 520. In some implementations, the substrate 522 can be a multi-layer substrate configured to support the dies and/or components and to provide electrical connectivity to external circuitry when the module 520 is mounted on a circuit board, such as a phone board.

The power amplifier die 524 can receive a RF signal at an input pin RF_IN of the module 520. The power amplifier die 524 can include one or more power amplifiers, including, for example, multi-stage power amplifiers configured to amplify the RF signal. The power amplifier die 524 can include an input matching network 530, a first stage power amplifier 532 (which can be referred to as a driver amplifier (DA)), an inter-stage matching network 534, a second stage power amplifier 536 (which can be referred to as an output amplifier (OA)), or any combination thereof.

A power amplifier can include the first stage power amplifier 532 and the second stage power amplifier 536. The first stage power amplifier 532 and/or the second stage power amplifier 536 can include one or more bipolar transistors 100 of FIG. 1A and/or one or more bipolar transistors 300 of FIG. 3A. Moreover, the bipolar transistor 100 of FIG. 1A and/or the bipolar transistor 300 of FIG. 3A can improve linearity, such as ACPR2, of the power module 520 and/or the power amplifier die 524 without substantially degrading break down voltage, such as $BV_{CEO}$.

The RF input signal can be provided to the first stage power amplifier 532 via the input matching network 530. The matching network 530 can receive a first stage bias signal. The first bias signal can be generated on the PA die 524, outside of the PA die 524 in the module 520, or external to the module 520. The first stage power amplifier 532 can amplify the RF input and provide the amplified RF input to the second stage power amplifier 536 via the inter-stage matching circuit 534. The inter-stage matching circuit 534 can receive a second stage bias signal. The second stage bias signal can be generated on the PA die 524, outside of the PA die 524 in the module 520, or external to the module 520. The second stage power amplifier 536 can generate the amplified RF output signal.

The amplified RF output signal can be provided to an output pin RF_OUT of the power amplifier die 524 via an output matching network 525. The matching network 525 can be provided on the module 520 to aid in reducing signal reflections and/or other signal distortions. The power amplifier die 524 can be any suitable die. In some implementations, the power amplifier 524 die is a gallium arsenide (GaAs) die. In some of these implementations, the GaAs die has transistors formed using a heterojunction bipolar transistor (HBT) process. In some other implementations, the power amplifier die is a silicon germanium (SiGe) die.

The module 520 can also include a one or more power supply pins, which can be electrically connected to, for example, the power amplifier die 524. The one or more power supply pins can provide supply voltages to the power amplifiers, such as $V_{SUPPLY1}$ and $V_{SUPPLY2}$, which can have different voltage levels in some implementations. The module 520 can include circuit element(s), such as inductor(s), which can be formed, for example, by a trace on the multi-chip module. The inductor(s) can operate as a choke inductor, and can be disposed between the supply voltage and the power amplifier die 524. In some implementations, the inductor(s) are surface mounted. Additionally, the circuit element(s) can include capacitor(s) electrically connected in parallel with the inductor(s) and configured to resonate at a frequency near the frequency of a signal received on the pin RF_IN. In some implementations, the capacitor(s) can include a surface mounted capacitor.

The module 520 can be modified to include more or fewer components, including, for example, additional power amplifier dies, capacitors and/or inductors. For instance, the module 520 can include one or more additional matching networks 525. As another example, the module 520 can include an additional power amplifier die, as well as an additional capacitor and inductor configured to operate as a parallel LC circuit disposed between the additional power amplifier die and the power supply pin of the module 520. The module 520 can be configured to have additional pins, such as in implementations in which a separate power supply is provided to an input stage disposed on the power amplifier die 520 and/or implementations in which the module 520 operates over a plurality of bands.

The module 520 can have a low voltage positive bias supply of about 3.2 V to 4.2 V, good linearity (for example, meeting any of the second channel linearity specification described herein), high efficiency (for example, PAE of approximately 40% at 28.25 dBm), large dynamic range, a small and low profile package (for example, 3 mm×3 mm×0.9 mm with a 10-pad configuration), power down control, support low collector voltage operation, digital enable, not require a reference voltage, CMOS compatible control signals, an integrated directional coupler, or any combination thereof.

In some implementations, the module 520 is a power amplifier module that is a fully matched 10-pad surface mount module developed for Wideband Code Division Multiple Access (WCDMA) applications. This small and efficient module can pack full 1920-1980 MHz bandwidth coverage into a single compact package. Because of high efficiencies attained throughout the entire power range, the module 520 can deliver desirable talk-time advantages for mobile phones. The module 520 can meet the stringent spectral linearity requirements of High Speed Downlink Packet Access (HSDPA), High Speed Uplink Packet Access (HSUPA), and Long Term Evolution (LTE) data transmission with high power added efficiency. A directional coupler can be integrated into the module 520 and can thus eliminate the need for an external coupler.

The die 524 can be a power amplifier die embodied in a single Gallium Arsenide (GaAs) Microwave Monolithic Integrated Circuit (MMIC) that includes all active circuitry of the module 520, such as one or more bipolar transistors 100 of FIG. 1A and/or one or more bipolar transistors 300 of FIG. 3A. The MMIC can include on-board bias circuitry, as well as input matching network 530 and inter-stage matching network 534. An output matching network 525 can have a 50 ohm load that is embodied separate from the die 524 within the package of the module 520 to increase and/or optimize efficiency and power performance.

The module 520 can be manufactured with a GaAs Heterojunction Bipolar Transistor (HBT) BiFET process that provides for all positive voltage DC supply operation while maintaining high efficiency and good linearity (for example, meeting any of the second channel linearity specification described herein). Primary bias to the module 520 can be supplied directly or via an intermediate component from any three-cell Ni—Cd battery, a single-cell Li-Ion battery, or other suitable battery with an output in the range selected from about 3.2 to 4.2 V. No reference voltage is needed in some implementations. Power down can be accomplished by setting an enable voltage to zero volts. No external supply side switch is needed as typical "off" leakage is a few microamperes with full primary voltage supplied from the battery, according to some implementations.

Figure 6:
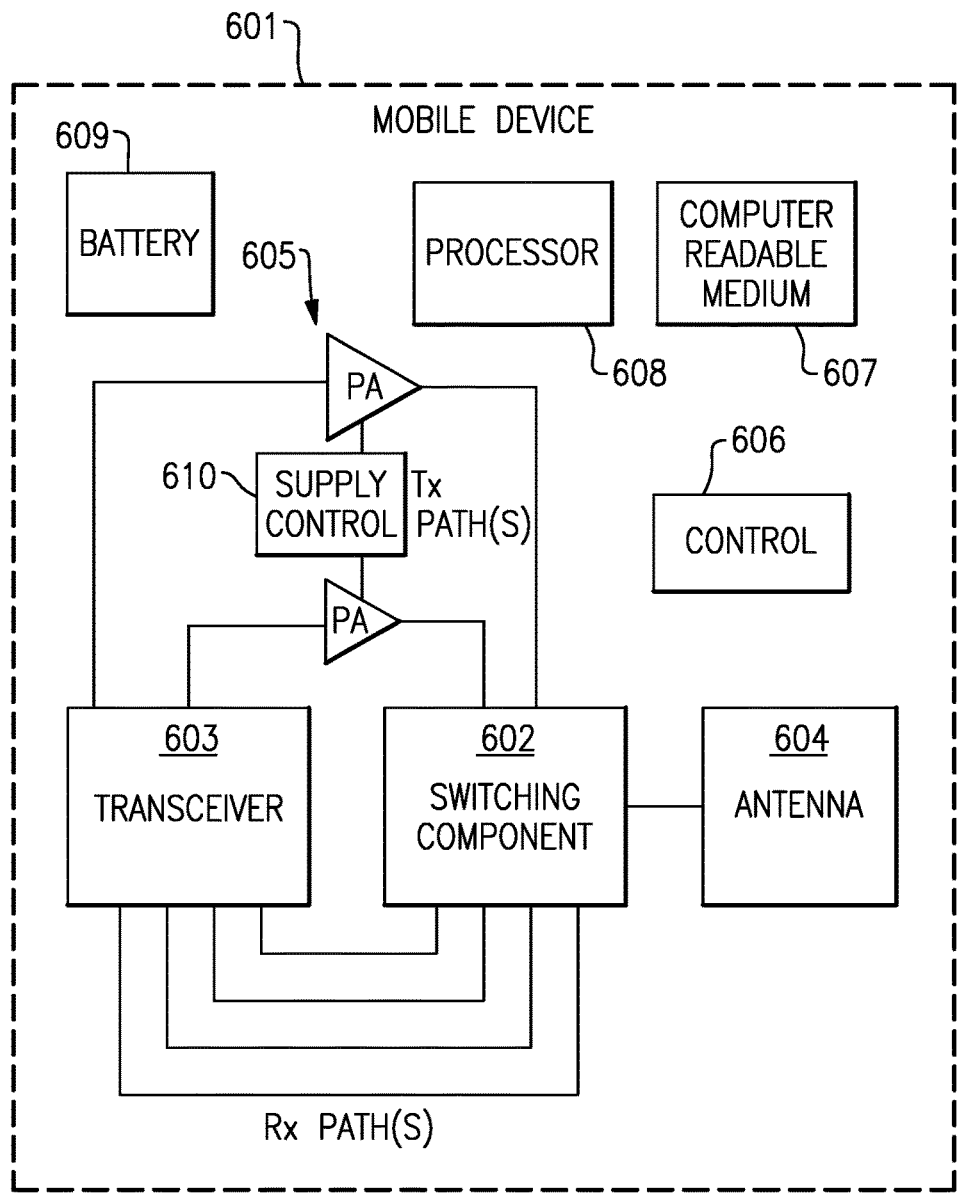
FIG. 6 is an illustrative block diagram of a mobile device that includes the power amplifier module of FIG. 5.

Any of the devices, systems, methods, and apparatus described herein can be implemented in a variety of electronic devices, such as a mobile device, which can also be referred to as a wireless device. FIG. 6 is a schematic block diagram of an example mobile device 601 that can include one or more bipolar transistors 100 of FIG. 1A and/or one or more bipolar transistors 300 of FIG. 3A.

Examples of the mobile device 601 can include, but are not limited to, a cellular phone (for example, a smart phone), a laptop, a tablet computer, a personal digital assistant (PDA), an electronic book reader, and a portable digital media player. For instance, the mobile device 601 can be a multi-band and/or multi-mode device such as a multi-band/multi-mode mobile phone configured to communicate using, for example, Global System for Mobile (GSM), code division multiple access (CDMA), 3G, 4G, and/or long term evolution (LTE).

In certain embodiments, the mobile device 601 can include one or more of a switching component 602, a transceiver component 603, an antenna 604, power amplifiers 605 that can include one or more bipolar transistors 100 of FIG. 1A and/or one or more bipolar transistors 300 of FIG. 3A, a control component 606, a computer readable medium 607, a processor 608, a battery 609, and supply control block 610.

The transceiver component 603 can generate RF signals for transmission via the antenna 604. Furthermore, the transceiver component 603 can receive incoming RF signals from the antenna 604.

It will be understood that various functionalities associated with the transmission and receiving of RF signals can be achieved by one or more components that are collectively represented in FIG. 6 as the transceiver 603. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 6 as the antenna 604. For example, a single antenna can be configured to provide both transmitting and receiving functionalities. In another example, transmitting and receiving functionalities can be provided by separate antennas. In yet another example, different bands associated with the mobile device 601 can be provided with different antennas.

In FIG. 6, one or more output signals from the transceiver 603 are depicted as being provided to the antenna 604 via one or more transmission paths. In the example shown, different transmission paths can represent output paths associated with different bands and/or different power outputs. For instance, the two example power amplifiers 605 shown can represent amplifications associated with different power output configurations (e.g., low power output and high power output), and/or amplifications associated with different bands.

In FIG. 6, one or more detected signals from the antenna 604 are depicted as being provided to the transceiver 603 via one or more receiving paths. In the example shown, different receiving paths can represent paths associated with different bands. For example, the four example paths shown can represent quad-band capability that some mobile devices 601 are provided with.

To facilitate switching between receive and transmit paths, the switching component 602 can be configured to electrically connect the antenna 604 to a selected transmit or receive path. Thus, the switching component 602 can provide a number of switching functionalities associated with an operation of the mobile device 601. In certain embodiments, the switching component 602 can include a number of switches configured to provide functionalities associated with, for example, switching between different bands, switching between different power modes, switching between transmission and receiving modes, or some combination thereof. The switching component 602 can also be configured to provide additional functionality, including filtering of signals. For example, the switching component 602 can include one or more duplexers.

The mobile device 601 can include one or more power amplifiers 605. RF power amplifiers can be used to boost the power of a RF signal having a relatively low power. Thereafter, the boosted RF signal can be used for a variety of purposes, including driving the antenna of a transmitter. Power amplifiers 605 can be included in electronic devices, such as mobile phones, to amplify a RF signal for transmission. For example, in mobile phones having a an architecture for communicating under the 3G and/or 4G communications standards, a power amplifier can be used to amplify a RF signal. It can be desirable to manage the amplification of the RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot. A power amplifier module can include one or more power amplifiers.

FIG. 6 shows that in certain embodiments, a control component 606 can be provided, and such a component can include circuitry configured to provide various control functionalities associated with operations of the switching component 602, the power amplifiers 605, the supply control 610, and/or other operating component(s).

In certain embodiments, a processor 608 can be configured to facilitate implementation of various functionalities described herein. Computer program instructions associated with the operation of any of the components described herein may be stored in a computer-readable memory 607 that can direct the processor 608, such that the instructions stored in the computer-readable memory produce an article of manufacture including instructions which implement the various operating features of the mobile devices, modules, etc. described herein.

The illustrated mobile device 601 also includes the supply control block 610, which can be used to provide a power supply to one or more power amplifiers 605. For example, the supply control block 610 can include a DC-to-DC converter. However, in certain embodiments the supply control block 610 can include other blocks, such as, for example, an envelope tracker configured to vary the supply voltage provided to the power amplifiers 605 based upon an envelope of the RF signal to be amplified.

The supply control block 610 can be electrically connected to the battery 609, and the supply control block 610 can be configured to vary the voltage provided to the power amplifiers 605 based on an output voltage of a DC-DC converter. The battery 609 can be any suitable battery for use in the mobile device 601, including, for example, a lithium-ion battery. With at least one power amplifier 605 that includes one or more bipolar transistors 100 of FIG. 1A and/or one or more bipolar transistors 300 of FIG. 3A, the power consumption of the battery 609 can be reduced and/or the reliability of the power amplifier 605 can be improved, thereby improving performance of the mobile device 601.

Some of the embodiments described above have provided examples in connection with modules and/or electronic devices that include power amplifiers, such as mobile phones. However, the principles and advantages of the embodiments can be used for any other systems or apparatus that have needs for a bipolar transistor with a high level of second channel linearity without degrading break down voltage.

Systems implementing one or more aspects of the present disclosure can be implemented in various electronic devices. Examples of electronic devices can include, but are not limited to, consumer electronic products, parts of the consumer electronic products, electronic test equipment, etc. More specifically, electronic devices configured implement one or more aspects of the present disclosure can include, but are not limited to, an RF transmitting device, any portable device having a power amplifier, a mobile phone (for example, a smart phone), a telephone, a base station, a femtocell, a radar, a device configured to communication according to the WiFi and/or Bluetooth standards, a television, a computer monitor, a computer, a hand-held computer, a tablet computer, a laptop computer, a personal digital assistant (PDA), a microwave, a refrigerator, an automobile, a stereo system, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Part of the consumer electronic products can include a multi-chip module including an RF transmission line, a power amplifier module, an integrated circuit including an RF transmission line, a substrate including an RF transmission line, the like, or any combination thereof. Moreover, other examples of the electronic devices can also include, but are not limited to, memory chips, memory modules, circuits of optical networks or other communication networks, and disk driver circuits. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The words "coupled," "connected," and the like, as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. All numerical values provided herein are intended to include similar values within a measurement error.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments is not intended to be exhaustive or to limit the invention to the precise form disclosed above. While specific embodiments of, and examples for, the invention are described above for illustrative purposes, For example, while processes or blocks are presented in a given order, alternative embodiments may perform routines having acts, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

While certain embodiments of the inventions have been described, these embodiments have been presented by way of example only, and are not intended to limit the scope of the disclosure. For example, various equivalent modifications are possible within the scope of the invention, as those skilled in the relevant art will recognize. Moreover, the elements and acts of the various embodiments described above can be combined to provide further embodiments. Indeed, the methods, systems, apparatus, and articles of manufacture described herein may be embodied in a variety of other forms; furthermore, various omissions, substitutions and changes in the form of the methods, systems, apparatus, and articles of manufacture described herein may be made without departing from the spirit of the disclosure. The accompanying claims and their equivalents are intended to cover such forms or modifications as would fall within the scope and spirit of the disclosure.

What is claimed is:

1. A method of forming a bipolar transistor comprising:
   forming a sub-collector over a substrate;
   forming a first portion of a collector over the sub-collector, the first portion having a varying doping concentration across a cross section of the first portion;
   doping a second portion of the collector to form a doping spike;
   forming a third portion of the collector over the doping spike; and
   forming a base of the bipolar transistor over the third portion of the collector.

2. The method of claim 1 wherein the bipolar transistor is a single heterojunction bipolar transistor.

3. The method of claim 2 wherein the doping spike extends substantially an entire length of the collector in a direction substantially parallel to a base-collector interface.

4. The method of claim 3 further comprising:
   doping a fourth portion of the collector disposed between the doping spike and the subcollector, the fourth portion comprising a substantially uniform doping and extending substantially an entire length of the collector in the direction substantially parallel to the base-collector interface.

5. The method of claim 3 wherein the doping spike is disposed within 0.5 µm from the base-collector interface.

6. The method of claim 3 wherein the collector further includes a grading that begins at a point farther from the base-collector interface than the doping spike.

7. The method of claim 1 wherein the thickness of the doping spike is substantially equal to 150 Å.

8. The method of claim 1 wherein the thickness of the doping spike is substantially equal to 100 Å.

9. The method of claim 1 wherein the doping spike is disposed at a location that results in approximately a local maximum of $BV_{CEO}$ of the bipolar transistor.

10. The method of claim 1 wherein the bipolar transistor is a GaAs transistor.

11. The method of claim 1 wherein the bipolar transistor is a SiGe transistor.

12. The method of claim 1 wherein the collector has a collector thickness from a base-collector interface to a collector-subcollector interface, and the doping spike is located within ⅓ of the collector thickness from the base-collector interface.

* * * * *